United States Patent
Kang

(10) Patent No.: US 7,148,931 B2
(45) Date of Patent: Dec. 12, 2006

(54) APPARATUS AND METHOD FOR SIGNAL PROCESSING IN DIGITAL VIDEO SYSTEM

(75) Inventor: Ho-woong Kang, Youngin (KR)

(73) Assignee: Samsung Electronics Co., Ltd., Gyunggi-do (KR)

( * ) Notice: Subject to any disclaimer, the term of this patent is extended or adjusted under 35 U.S.C. 154(b) by 581 days.

(21) Appl. No.: 10/431,514

(22) Filed: May 8, 2003

(65) Prior Publication Data

US 2004/0008279 A1    Jan. 15, 2004

(30) Foreign Application Priority Data

Jul. 12, 2002    (KR) ............................... 2002-40599

(51) Int. Cl.
| | |
|---|---|
| H03M 1/12 | (2006.01) |
| H04B 1/66 | (2006.01) |
| H04N 7/12 | (2006.01) |
| H04N 11/02 | (2006.01) |
| H04N 11/04 | (2006.01) |
| G06K 9/36 | (2006.01) |
| G06K 9/38 | (2006.01) |
| G06K 9/46 | (2006.01) |

(52) U.S. Cl. .................. 348/572; 375/240.03; 382/251
(58) Field of Classification Search ................ 348/572; 382/251–253; 375/240.03
See application file for complete search history.

(56) References Cited

U.S. PATENT DOCUMENTS

| | | | | |
|---|---|---|---|---|
| 5,565,930 A | * | 10/1996 | Bolger et al. ................ 348/572 |
| 5,663,763 A | * | 9/1997 | Yagasaki et al. ........ 375/240.03 |
| 5,809,459 A | * | 9/1998 | Bergstrom et al. .......... 704/223 |
| 5,940,138 A | * | 8/1999 | Lowe .......................... 348/574 |
| 5,969,764 A | * | 10/1999 | Sun et al. .............. 375/240.06 |
| 6,057,891 A | * | 5/2000 | Guerin et al. ................ 348/572 |
| 6,118,905 A | * | 9/2000 | Uehara et al. .............. 382/252 |
| 6,181,826 B1 | * | 1/2001 | Weldy et al. ................ 382/240 |
| 6,208,689 B1 | * | 3/2001 | Ohira et al. ........... 375/240.12 |
| 6,876,709 B1 | * | 4/2005 | Kim et al. ................... 375/341 |
| 6,937,767 B1 | * | 8/2005 | Burak et al. ................. 382/232 |
| 6,937,770 B1 | * | 8/2005 | Oguz et al. ................. 382/235 |
| 2002/0126752 A1 | * | 9/2002 | Kim ...................... 375/240.03 |
| 2004/0032530 A1 | * | 2/2004 | Kang .......................... 348/572 |

FOREIGN PATENT DOCUMENTS

| | | |
|---|---|---|
| JP | 63-182695 A | 7/1988 |
| JP | 4-125588 A | 4/1992 |
| JP | 7-219493 A | 8/1995 |
| JP | 9-018723 A | 1/1997 |

* cited by examiner

Primary Examiner—Brian P. Yenke
(74) Attorney, Agent, or Firm—Sughrue Mion, PLLC

(57) ABSTRACT

An apparatus and a method for signal processing in a digital video system. The apparatus for signal processing of a digital video system has: an input unit to receive a signal quantized for M bits; and an output unit to output a value of A for $(2^{M-N}-B)$ times and a value of A+1 for B times during vertical scan of $2^{M-N}$ times when a decimal value of high N bits is A and a decimal value of low bits of (M−N) excluding N bits is B and M>N. Accordingly, as an image signal quantized with a greater number of bits is displayed on a screen with a lesser number of bits, the quality of a picture can be improved.

14 Claims, 3 Drawing Sheets

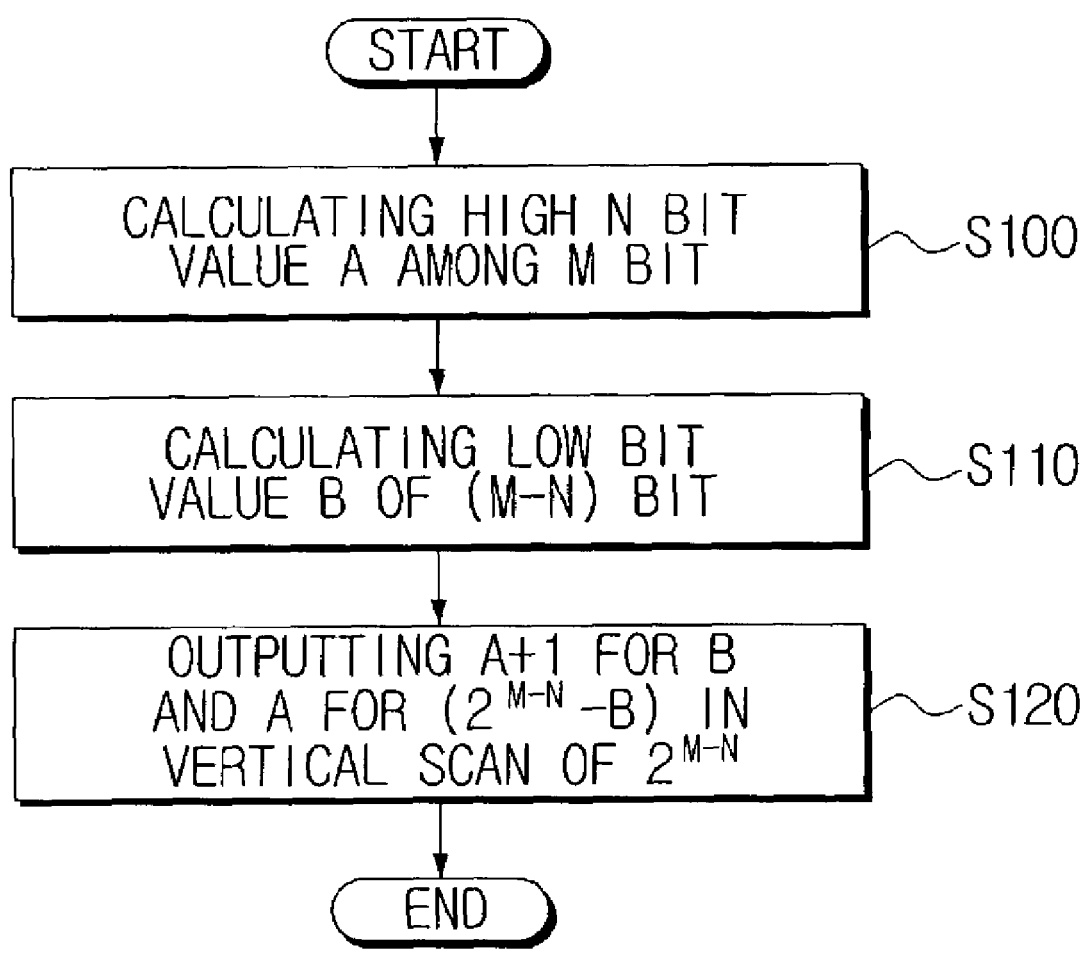

APPARATUS AND METHOD FOR SIGNAL PROCESSING IN DIGITAL VIDEO SYSTEM

BACKGROUND OF THE INVENTION

1. Field of the Invention

The present invention relates to an apparatus and a method for signal processing in a digital video system, and more particularly, to an apparatus and a method for signal processing in a digital video system capable of displaying with a lesser number of bits and minimizing the loss of an image signal quantized with a greater number of bits. The present application is based on Korean Patent Application No. 2002-40599, which is incorporated herein by reference.

2. Description of the Prior Art

In a digital video system like a DTV (digital TV), an A/D conversion (analog to digital conversion) process to digital code an analog input signal is required in order to display an image on a screen.

The A/D conversion process is used to convert a continuously changing analog image or an audio signal into a discrete digital signal. A sampling frequency and quantization bit number in the A/D conversion process influence the quality of a picture and sound, and the amount of information of the digital video system. In other words, as the sampling frequency increases, a higher band frequency can be reproduced. Thus, the quality of the picture and sound can be upgraded. Yet, the amount of information for transmission and recording also increases in proportion to the sampling frequency.

Similarly, the quantization bit number for one sample influences the quality of picture and sound, and the amount of information. For example, a mosaic screen frequently used for protecting one's portrait is very coarse and the content of the mosaic is actually difficult to recognize, since the quantization bit number is set up to be very low in digital signal processing. Unlike the above case, when the quantization bit number is increased, quantization stem width is reduced and the quality of picture and sound is improved. Yet, the amount of information is increased in proportion to the quantization bit number like the case of the sampling frequency. Thus, it is difficult to increase the number without a plan.

Due to the above technical limitation, audio systems having a lesser amount of information were digitalized before video systems, and the sampling frequency and the quantization bit number of a CD, which is a representative digital audio system are individually 44.1 kHz and 16 bits, respectively. In the case of a motion picture signal having 200 times more reproducing bandwidth than an audio signal, when the quantization bit number is more than 16 bits, the amount of information is astronomically increased. Thus, it is realistically impossible to convert and record an image signal into a digital code. Therefore, the quantization bit number of the digital video system should be decided considering economical efficiency, visual characteristics of people and the quality of picture that has no practical problem in subjective evaluation that can be judged from a real screen. Generally, 8 bits or 10 bits are used for the quantization bit number, and recently, a digital processor camera of 12 bits has been introduced.

The resolution of 8 bits has a maximum level of $2^8$ (=256), that of 10 bits has a maximum level of $2^{10}$ (=1024) and that of 12 bit has a maximum level of $2^{12}$ (=4096). Accordingly, an 8 bit system has a much lesser amount of information and the quantization stem is coarse compared to a 10 bit system. On the other hand, an 8 bit system has a longer quantization stem width than a 10 bit system. Thus, it is difficult for an 8 bit system to describe a slant object such as an oblique line or an arc in detail like the analog system does.

Accordingly, to obtain good quality of picture and sound in the digital video system, the quantization bit number should be increased, but the circuit structure for processing the increased amount of information is complicated, and the price for the product is also increased.

For the above reasons, the digital video system generally applies 8 bits for the quantization bit number, and in this case, the 8 bits are used not only for the quantization bit number but also for a luminance signal (Y) or a chrominance signal (Cb, Cr) for expressing a picture element or a pixel that is a composition element corresponding to one dot in a screen. In other words, in an 8 bit digital video system, even though an image signal input in the A/D conversion process is quantized for more than 10 bits, the low 2 bits are ignored and only the remaining 8 bits are used to display an image on a screen.

However, the realization of quantization of more than 8 bits in the A/D conversion process is easy thanks to technical development, and thus the price of a product is lowered. On the other hand, to increase quantization level more than 8 bits for a luminance (Y) or chrominance signal (Cb, Cr) for expressing a pixel is a relatively difficult matter in realization of a circuit or the price.

Accordingly, in the digital video system, an apparatus and a method for signal processing capable of improving the quality of a picture by reflecting discarded low bits is required when low bits are discarded at quantized data and only the high 8 bits are used to display a screen in the case that an image signal input in the A/D conversion process can be quantized to more than 10 bits.

SUMMARY OF THE INVENTION

The present invention has been made to overcome the above-mentioned problem of the prior art. Accordingly, it is the object of the present invention to provide an apparatus and a method for signal processing capable of improving the quality of a picture by displaying an input image signal quantized for more than 8 bits in a digital video system capable of displaying signals such as luminance or chrominance with 8 bits of quantized levels per pixel.

The above object of the present invention is realized by providing an apparatus for signal processing in a digital video system capable of displaying an image signal quantized for N bits per pixel, comprising: an adder input unit to output zero for ($2^{M-N}$−B) and 1 for B during vertical scan of $2^{M-N}$ when a decimal value of the high N bits is A and a decimal value of the low bits of (M−N) bits excluding N bits is B in an input image signal quantized for M bits and M>N; and an adder to output a value obtained by adding the A and an output value of the adder input unit.

It is preferable that the adder outputs the A value when the high N bits are all 1, and outputs the added value only when an enable signal is output from the outside.

In addition, it is recommended that the M bits are 10 bits and the N bits are 8 bits or the M bits are 12 bits and the N bits is 8 bits.

An apparatus for signal processing in a digital video system to achieve the above object comprises: an input unit to receive a signal quantized for M bits; and an output unit to output A for ($2^{M-N}$−B) and A+1 for B during vertical scan of $2^{M-N}$ when a decimal value of the high N bits is A and a decimal value of the low bits of (M−N) excluding N bits is B and M>N.

It is preferable that the output unit outputs the A when the high bits are all 1, and the M bits are 10 bits and the N bits are 8 bits, or the M bits are 12 bits and the N bits are 8 bits.

In the meantime, a method for signal processing in a digital video system capable of displaying an image signal quantized for N bits per pixel, comprises the steps of: calculating a decimal value A of the high N bits in an input image signal quantized for M bits and M>N; calculating a decimal value B of the low bits of (M−N) bits excluding N bits; and outputting A for ($2^{M-N}$−B) and A+1 for B during vertical scan of $2^{M-N}$.

It is preferable that the method for signal processing further comprises a step of outputting the A when the high N bits are all 1. It is recommended that in the outputting step, the values are outputting only when an enable signal is input from the outside.

Moreover, it is advisable that the M bits are 10 bits and the N bits are 8 bits, or the M bits are 12 bits and the N bits are 8 bits.

BRIEF DESCRIPTION OF THE DRAWINGS

The above-mentioned object and the feature of the present invention will be more apparent by describing the preferred embodiment of the present invention by referring to the appended drawings, in which:

FIG. 4 is a view showing the operation of a signal processing apparatus of a digital video system according to the present invention.

DESCRIPTION OF THE PREFERRED EMBODIMENT

Hereinbelow, the present invention will be described in greater detail by referring to the appended drawings.

Figure 1:
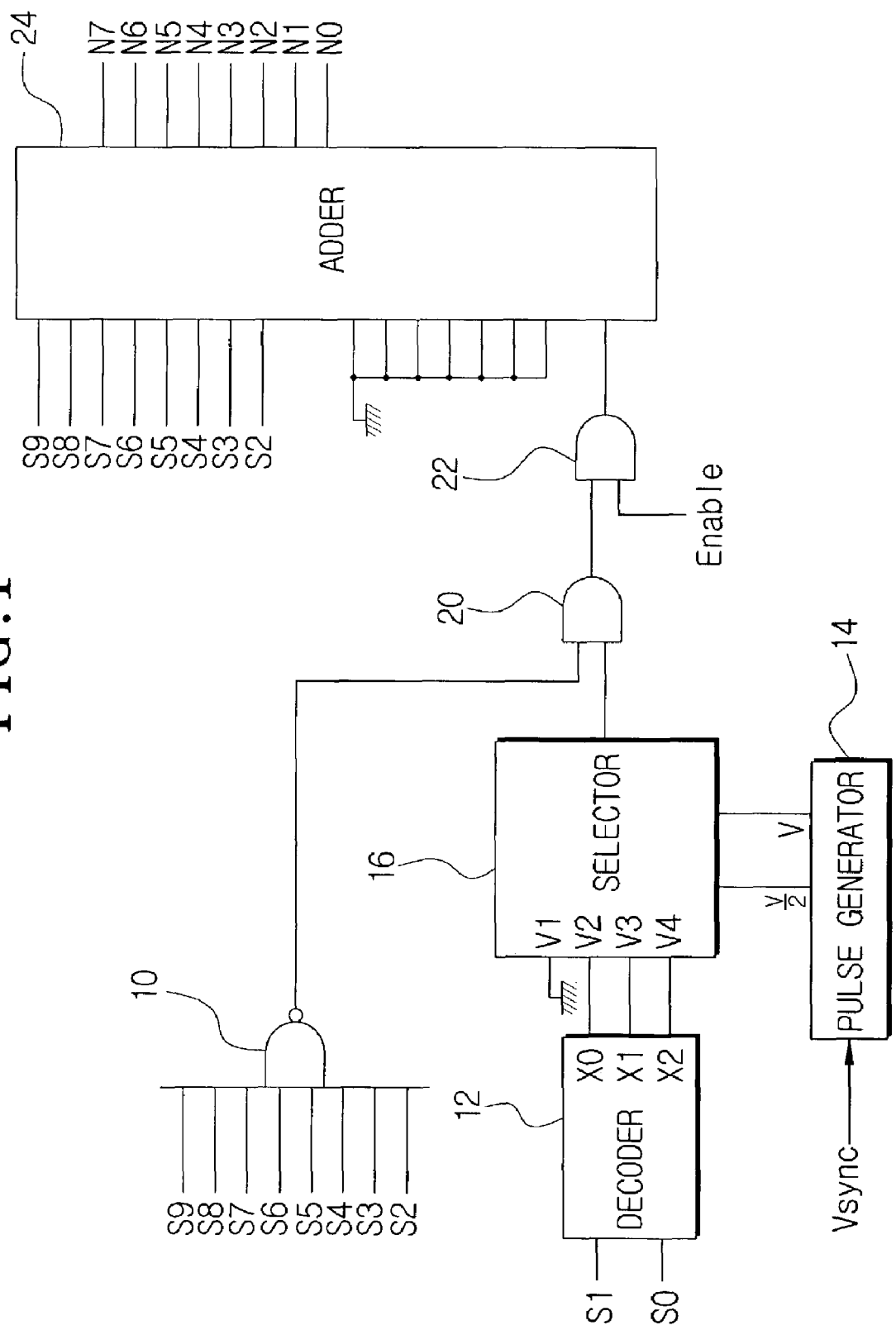
FIG. 1 is a view showing the circuit of a signal processing apparatus of a digital video system according to the present invention.

FIG. 1 is view showing the circuit of a signal processing apparatus of a digital video system according to the present invention. Referring to FIG. 1, the signal processing apparatus of the digital video system comprises an NAND gate 10, a decoder 12, a pulse generator 14, a selector 16, a first AND gate 20, a second AND gate 22 and an adder 24.

The NAND gate 10 receives the high 8 bits from S2 to S9, and the decoder 12 receives the low bits of S0 and S1. Here, S0 to S9 pass through A/D conversion process and display an image signal digital processed to 10 bits.

The decoder 12 outputs values shown in Table 1 to output terminals of X2, X1 and X0 in accordance with the change of input bit value of S0 and S1.

TABLE 1

| S1 | S0 | X2 | X1 | X0 |
|----|----|----|----|----|
| 0  | 0  | 0  | 0  | 0  |
| 0  | 1  | 0  | 0  | 1  |
| 1  | 0  | 0  | 1  | 1  |
| 1  | 1  | 1  | 1  | 1  |

The Output value of the decoder 12 is transmitted to the input value of the selector 16. In other words, the input terminal V1 of the selector 16 is grounded, and values output from the output terminals of X0, X1 and X2 are into the input terminals of V2, V3 and V4. The selector 16 selects one among the values input into the input terminals of V1, V2, V3 and V4 based on an input value of the pulse generator 14 and outputs the selected value.

Figure 2:
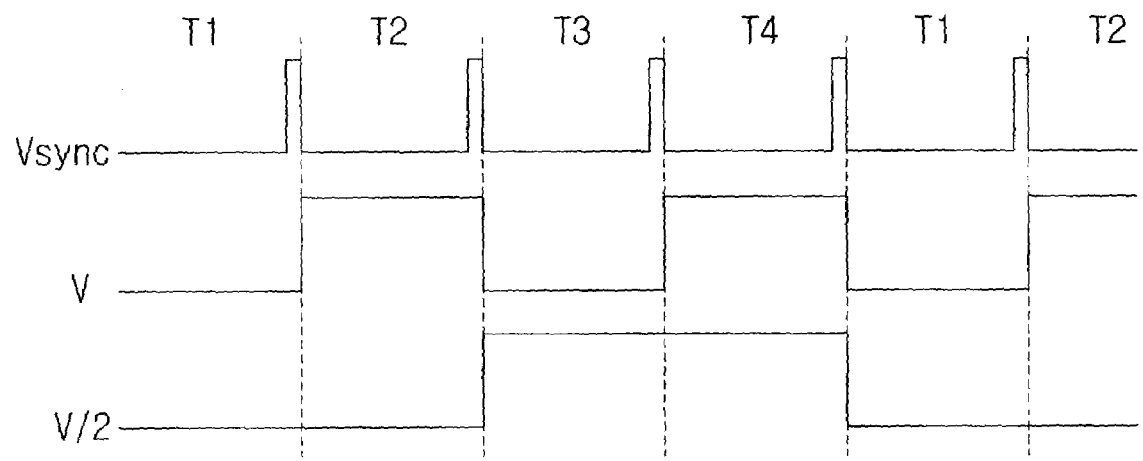
FIG. 2 is a view showing the waveform of Vsync, V and V/2.

The pulse generator 14 receives a vertical synchronization signal Vsync, and generates signal waveforms of V and V/2 shown in FIG. 2. The vertical synchronization signal Vsync is a signal used for informing the start of a screen when an image is displayed. Referring to FIG. 2, V waveform repeats 1 and 0 whenever the vertical synchronization signal Vsync is generated and terminated, and V/2 waveform repeats 1 and 0 whenever V waveform is generated and terminated. In other words, V/2 and V values input into a selection terminal of the selector 16 through the pulse generator 14 repeatedly change in the order of 00->01->10->11->00. Accordingly, the selector 16 outputs values input in the order of input terminals of V1, V2, V3 and V4. Therefore, values output to the selector 16 based on the values of S1 and S0 input into the decoder 12 can be arranged as the following Table 2.

TABLE 2

| S1 | S0 | V1 | V2 | V3 | V4 |
|----|----|----|----|----|----|
| 0  | 0  | 0  | 0  | 0  | 0  |
| 0  | 1  | 0  | 1  | 0  | 0  |
| 1  | 0  | 0  | 1  | 1  | 0  |
| 1  | 1  | 0  | 1  | 1  | 1  |

The adder 24 outputs 8 bit values of N0 to N7 by adding bit value input through the first and second AND gates 20 and 22 to the values of S9 to S2.

As can be seen in FIG. 1, the value output through an input unit of the adder 24 comprised of the NAND gate 10, decoder 12, pulse generator 14, selector 16, first and second AND gates 20 and 22 is zero or 1. The NAND gate 10 and the first AND gate 20 makes the output of the selector 20 zero when S9 to S2 are 11111111. This is to prevent a result value from being 00000000 by adding 1 to 11111111. In other words, when S9 to S2 have a maximum value, they cannot have a greater value, thus there is no point of compensation. In addition, the second AND gate 22 controls the operation of the entire circuit by allowing the selector 20 to output normally only when an externally input enable signal is 1.

FIG. 4 is a flow chart showing a method for signal processing in a digital video system according to the present invention.

Referring to FIG. 4, high N bit value, A is calculated among input M bits (S 100). In FIG. 1, the case of M=10 and N=8 is shown, that is 8 bits are output with respect to an input value of 10 bits. Here, when S9 to S0 is 1000000010, the high 8 bit value A is 128(=1000000).

Then, low bit value B of (M−N) bit is calculated (S 110). When M=10 and N=8, then M−N=2. Therefore, the low bits of 2 bits are S1 and S0, and the low bits of 2 bits of the previous example is 2(=10), thus B is 2.

Furthermore, from $2^{M-N}$ times vertical scanning, A+1 is output for B times and A is output for $2^{M-N}$−B times (S 120). In the previous example, M−N=2, thus $2^{M-N}=2^2=4$. Therefore, from four (4) times vertical scanning, A+1=129 is output for B times i.e. two (2) times and A=128 is output for two ($2^2$−2=2) times.

This method outputs a value obtained as the adder 24 adds 1 or zero input through the first and second AND gates 20 and 22 by a vertical synchronization signal with S9 to S2.

Accordingly, the above described apparatus for signal processing in a digital video system is comprised of an input unit to receive a signal quantized as M bit, and an output unit which outputs A for $2^{M-N}$-B times and A+1 for B times during the $2^{M-N}$ times vertical scanning when a decimal value A of the high N bits is A and a decimal value B of the low bits of (M–N) excluding, N bits is B in M bits.

Figure 3:
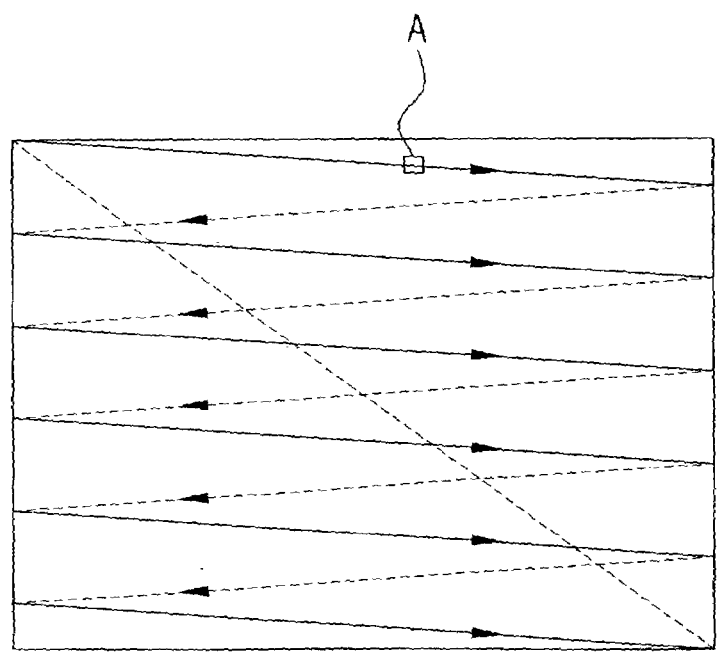
FIG. 3 is a view showing the operation of a signal processing apparatus of a digital video system.

FIG. 3 is a view showing the process of scanning in a general digital video system.

Referring to FIG. 3, let us suppose that there is one pixel on a screen in A, and an input image calculated from an A/D conversion process is quantized to 10 bit and S9 to S0 is 1000000010. When this value is used as a luminance level of pixel A on a screen, S1 and S0 values are ignored when a conventional method is applied. Thus, a luminance value of A is fixed to be 128 (=10000000).

However, in the present invention, N value output through the adder 24 is 10000000->10000001->10000001->10000000, and thus the luminance value of A is repeatedly changed as 128->129->129->128. The change of the luminance value of A is based on the vertical synchronization signal Vsync. Thus, the luminance value of A on a screen is not seen as flickering between 128 and 129, and instead, a viewer feels that the luminance value is a medium value of 128 and 129, that is 128+½.

When S9 to S0 is 100000001, the luminance value of A changes as 128->129->128->128, and at this time, the viewer feels like the luminance value is 128+¼. Similarly, when S9 to S0 is 100000011, the luminance value of A changes as 128->129->129->129, and this is the luminance value of 128 +¾.

According to the above method, it is possible to express values of ¼, 2/4 and ¾ of one level. Therefore, the hardware resolution of a system is maximum $2^8$ (=256), but a viewer can feel visual resolution of a system as maximum $2^{10}$ (=1024). In other words, although an image signal quantized with a greater number of bits is displayed on a screen with a lesser number of bits, the quality of a picture can be improved.

According to the present invention, in a digital video system capable of displaying an image signal with an 8 bit quantization level per pixel, when an image signal quantized for more than 8 bits is input, the low bits are discarded, but they are added to the high bits based on a vertical synchronization signal Vsync. Thus, a visually improved picture can be displayed.

Although the preferred embodiment of the present invention has been described, it will be understood by those skilled in the art that the present invention should not be limited to the described preferred embodiment, but various exchanges and modifications can be made within the spirit and the scope of the present invention. Accordingly, the scope of the present invention is not limited within the described range but the following claims.

What is claimed is:

1. An apparatus for signal processing in a digital video system, comprising:
    an input unit to receive a signal quantized for M bits; and
    an output unit to output A for ($2^{M-N}$-B) times and A+1 for B times during a vertical scan of $2^{M-N}$ times when a decimal value of high N bits is A and a decimal value of low bits of (M–N) excluding N bits is B and M>N.

2. The apparatus for signal processing of claim 1, wherein the output unit outputs the A value when the high bits are all 1.

3. The apparatus for signal processing of claim 1, wherein the M bits are 10 bits and the N bits are 8 bits.

4. The apparatus for signal processing of claim 1, wherein the M bits are 12 bits and the N bits are 8 bits.

5. An apparatus for signal processing in a digital video system capable of displaying an image signal quantized for N bits per pixel, comprising:
    an adder input unit to output zero for ($2^{M-N}$-B) times and 1 for B times during a vertical scan of $2^{M-N}$ times when a decimal value of high N bits is A and a decimal value of low bits of (M–N) bits excluding N bits is B in an input image signal quantized for M bits and M>N; and
    an adder to output a value obtained by adding the A value and an output value of the adder input unit.

6. The apparatus for signal processing of claim 5, wherein the adder outputs the A value when the high N bits are all 1.

7. The apparatus for signal processing of claim 5, wherein the adder outputs the added value only when an enable signal is output from an outside.

8. The apparatus for signal processing of claim 5, wherein the M is 10 bits, and the N is 8 bits.

9. The apparatus for signal processing of claim 5, wherein the M is 12 bits and the N is 8 bits.

10. A method for signal processing in a digital video system capable of displaying an image signal quantized for N bits per pixel, comprising the steps of:
    calculating a decimal value A of high N bits in an input image signal quantized for M bits and M>N;
    calculating a decimal value B of low bits of (M–N) bits excluding N bits; and
    outputting the decimal value A for ($2^{M-N}$-B) times and A+1 for B times during a vertical scan of $2^{M-N}$ times.

11. The method for signal processing of claim 10, further comprising a step of outputting the decimal value A when the high N bits are all 1.

12. The method for signal processing of claim 10, wherein, in the outputting step, the values are outputted only when an enable signal is input from an outside.

13. The method for signal processing of claim 10, wherein the M is 10 bits and the N is 8 bits.

14. The method for signal processing of claim 10, wherein the M is 12 bits and the N is 8 bits.

* * * * *